(12) United States Patent
Tsai et al.

(10) Patent No.: US 11,221,263 B2
(45) Date of Patent: Jan. 11, 2022

(54) MICROELECTROMECHANICAL FORCE SENSOR HAVING A STRAIN TRANSFER LAYER ARRANGED ON THE SENSOR DIE

(71) Applicant: NEXTINPUT, INC., Mountain View, CA (US)

(72) Inventors: Julius Minglin Tsai, San Jose, CA (US); Dan Benjamin, Atlanta, GA (US)

(73) Assignee: NEXTINPUT, INC., Mountain View, CA (US)

( * ) Notice: Subject to any disclaimer, the term of this patent is extended or adjusted under 35 U.S.C. 154(b) by 0 days.

(21) Appl. No.: 16/632,795

(22) PCT Filed: Jul. 19, 2018

(86) PCT No.: PCT/US2018/042883
§ 371 (c)(1),
(2) Date: Jan. 21, 2020

(87) PCT Pub. No.: WO2019/018641
PCT Pub. Date: Jan. 24, 2019

(65) Prior Publication Data
US 2020/0149983 A1 May 14, 2020

Related U.S. Application Data

(60) Provisional application No. 62/534,287, filed on Jul. 19, 2017.

(51) Int. Cl.
*G01L 1/22* (2006.01)
*H01L 41/053* (2006.01)
(Continued)

(52) U.S. Cl.
CPC .............. *G01L 1/16* (2013.01); *B81B 3/0072* (2013.01); *B81B 7/007* (2013.01); *G01L 1/18* (2013.01); *B81B 2201/0264* (2013.01)

(58) Field of Classification Search
CPC . G01L 1/16; G01L 1/18; H01L 41/053; H01L 41/083; G06F 3/033; G09G 5/00; G09G 5/08
See application file for complete search history.

(56) References Cited

U.S. PATENT DOCUMENTS

| 4,594,639 A | 6/1986 | Kuisma |
| 4,658,651 A | 4/1987 | Le |

(Continued)

FOREIGN PATENT DOCUMENTS

| CN | 101341459 A | 1/2009 |
| CN | 101458134 A | 6/2009 |

(Continued)

OTHER PUBLICATIONS

PCT/US2018/042883, International Search Report and Written Opinion dated Dec. 6, 2018.

(Continued)

*Primary Examiner* — Brandi N Hopkins
(74) *Attorney, Agent, or Firm* — Meunier Carlin & Curfman LLC

(57) ABSTRACT

Described herein is a ruggedized microelectromechanical ("MEMS") force sensor including a sensor die and a strain transfer layer. The MEMS force sensor employs piezoresistive or piezoelectric strain gauges for strain sensing where the strain is transferred through the strain transfer layer, which is disposed on the top or bottom side of the sensor die. In the case of the top side strain transfer layer, the MEMS force sensor includes mechanical anchors. In the case of the bottom side strain transfer layer, the protection layer is added on the top side of the sensor die for bond wire protection.

15 Claims, 8 Drawing Sheets

(51) Int. Cl.
*H01L 41/113* (2006.01)
*G01L 1/16* (2006.01)
*B81B 3/00* (2006.01)
*B81B 7/00* (2006.01)
*G01L 1/18* (2006.01)

(56) References Cited

U.S. PATENT DOCUMENTS

| | | |
|---|---|---|
| 4,814,856 A | 3/1989 | Kurtz et al. |
| 4,849,730 A | 7/1989 | Izumi et al. |
| 4,914,624 A | 4/1990 | Dunthorn |
| 4,918,262 A | 4/1990 | Flowers et al. |
| 4,933,660 A | 6/1990 | Wynne |
| 4,983,786 A | 1/1991 | Stevens |
| 5,095,401 A | 3/1992 | Zavracky et al. |
| 5,159,159 A | 10/1992 | Asher |
| 5,166,612 A | 11/1992 | Murdock |
| 5,237,879 A | 8/1993 | Speeter |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A | 2/1997 | Marek et al. |
| 5,673,066 A | 9/1997 | Toda et al. |
| 5,773,728 A | 6/1998 | Tsukada et al. |
| 5,889,236 A | 3/1999 | Gillespie et al. |
| 5,921,896 A | 7/1999 | Boland |
| 5,969,591 A | 10/1999 | Fung |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,868,731 B1 | 3/2005 | Gatesman |
| 6,879,318 B1 | 4/2005 | Chan et al. |
| 6,888,537 B2 | 5/2005 | Benson et al. |
| 6,915,702 B2 | 7/2005 | Omura et al. |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 | 1/2008 | Vaganov et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,367,232 B2 | 5/2008 | Vaganov |
| 7,406,661 B2 | 7/2008 | Väänänen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Satai et al. |
| 7,476,952 B2 | 1/2009 | Vaganov et al. |
| 7,508,040 B2 | 3/2009 | Nikkel et al. |
| 7,554,167 B2 | 6/2009 | Vaganov |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,829,960 B2 | 11/2010 | Takizawa |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Mölne et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,096,188 B2 | 1/2012 | Wilner |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,250,921 B2 | 8/2012 | Nasiri et al. |
| 8,253,699 B2 | 8/2012 | Son |
| 8,260,337 B2 | 9/2012 | Periyalwar et al. |
| 8,269,731 B2 | 9/2012 | Mölne |
| 8,289,288 B2 | 10/2012 | Whytock et al. |
| 8,289,290 B2 | 10/2012 | Klinghult |
| 8,297,127 B2 | 10/2012 | Wade et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |

(56) References Cited

U.S. PATENT DOCUMENTS

| | | |
|---|---|---|
| 8,477,115 B2 | 7/2013 | Rekimoto |
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,931,347 B2 | 1/2015 | Donzier et al. |
| 8,973,446 B2 | 3/2015 | Fukuzawa et al. |
| 8,984,951 B2 | 3/2015 | Landmann et al. |
| 9,032,818 B2 | 5/2015 | Campbell et al. |
| 9,097,600 B2 | 8/2015 | Khandani |
| 9,487,388 B2 | 11/2016 | Brosch |
| 9,493,342 B2 | 11/2016 | Brosch |
| 9,709,509 B1 | 7/2017 | Yang et al. |
| 9,772,245 B2 | 9/2017 | Besling et al. |
| 10,962,427 B2 | 3/2021 | Youssefi et al. |
| 2003/0067448 A1 | 4/2003 | Park |
| 2003/0128181 A1 | 7/2003 | Poole |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2005/0083310 A1 | 4/2005 | Safai et al. |
| 2005/0190152 A1* | 9/2005 | Vaganov ............ G06F 3/0338 345/157 |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0083962 A1* | 4/2008 | Vaganov ............ G01L 1/18 257/417 |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0102403 A1 | 4/2010 | Celik-Butler et al. |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1 | 12/2010 | Vaganov et al. |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |

(56) References Cited

U.S. PATENT DOCUMENTS

| | | |
|---|---|---|
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0061823 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0234112 A1 | 9/2012 | Umetsu et al. |
| 2012/0256237 A1 | 10/2012 | Lakamraju et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0187201 A1 | 7/2013 | Elian |
| 2013/0239700 A1 | 9/2013 | Benfield et al. |
| 2013/0255393 A1 | 10/2013 | Fukuzawa et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0090488 A1 | 4/2014 | Taylor et al. |
| 2014/0283604 A1 | 9/2014 | Najafi et al. |
| 2014/0367811 A1 | 12/2014 | Nakagawa et al. |
| 2015/0110295 A1 | 4/2015 | Jenkner et al. |
| 2015/0241465 A1 | 8/2015 | Konishi |
| 2016/0069927 A1 | 3/2016 | Hamamura |
| 2016/0245667 A1 | 8/2016 | Najafi et al. |
| 2016/0332866 A1* | 11/2016 | Brosh .................. B81B 3/0056 |
| 2016/0363490 A1 | 12/2016 | Campbell et al. |
| 2017/0103246 A1 | 4/2017 | Pi |
| 2017/0234744 A1 | 8/2017 | Tung et al. |
| 2019/0383675 A1 | 12/2019 | Tsai et al. |
| 2019/0383676 A1 | 12/2019 | Foughi et al. |
| 2020/0234023 A1 | 7/2020 | Tsai et al. |

FOREIGN PATENT DOCUMENTS

| | | |
|---|---|---|
| CN | 101801837 A | 8/2010 |
| CN | 201653605 | 11/2010 |
| CN | 101929898 A | 12/2010 |
| CN | 102062662 A | 5/2011 |
| CN | 102998037 | 3/2013 |
| CN | 103308239 A | 9/2013 |
| CN | 102853950 A | 3/2015 |
| CN | 104535229 | 4/2015 |
| CN | 104581605 A | 4/2015 |
| CN | 104919293 A | 9/2015 |
| CN | 105934661 A | 9/2016 |
| DE | 102010012441 | 9/2011 |
| JP | 2004-156937 | 6/2004 |
| JP | 2010147268 | 7/2010 |
| WO | 93/10430 A1 | 5/1993 |
| WO | 2004/113859 | 12/2004 |
| WO | 2007/139695 | 12/2007 |
| WO | 2011/065250 A1 | 6/2011 |
| WO | 2013/067548 | 5/2013 |
| WO | 2015/106246 A1 | 7/2015 |
| WO | 2019/023552 | 1/2019 |

OTHER PUBLICATIONS

Mei, T., et al., "Design and Fabrication of an Integrated Three-Dimensional Tactile Sensor for Space Robotic Applications," Micro Electro Mechanical Systems, MEMS '99, Twelfth IEEE International Conference, Orlando Florida, Jan. 21, 1999, pp. 112-117.

Nesterov, V., et al., "Modelling and investigation of the silicon twin design 3D micro probe," Journal of Micromechanics and Microengineering, vol. 15, 2005, pp. 514-520.

Communication Pursuant to Rule 164(1) EPC issued for European Application No. 18834426.1, dated Mar. 10, 2021.

Extend Search Report issued for European Application No. 18834426.1, dated Jun. 10, 2021.

Office Action issued for Chinese Application No. 2018800601531, dated Apr. 6, 2021.

* cited by examiner

MICROELECTROMECHANICAL FORCE SENSOR HAVING A STRAIN TRANSFER LAYER ARRANGED ON THE SENSOR DIE

CROSS-REFERENCE TO RELATED APPLICATIONS

This application is a national stage application filed under 35 U.S.C. § 371 of PCT/US2018/042883 filed Jul. 19, 2018, which claims the benefit of U.S. provisional patent application No. 62/534,287, filed on Jul. 19, 2017, and entitled "STRAIN TRANSFER STACKING IN A MEMS FORCE SENSOR," the disclosures of which is expressly incorporated herein by reference in their entireties.

FIELD OF TECHNOLOGY

The present disclosure relates to microelectromechanical ("MEMS") force sensor with a strain transfer layer.

BACKGROUND

Force sensing applications require a medium to transfer force or strain to the sensing element. In conventional systems, the transfer medium is typically implemented on the assembly mechanism but not on the sensor itself. When the transfer medium is implemented on the assembly mechanism, there is always tolerance in the alignment between the transfer medium and the sensor. For better accuracy and tighter tolerance, there is a need to implement the transfer medium onto the sensor.

SUMMARY

The present disclosure pertains to a MEMS force sensor comprising a strain transfer layer. According to one implementation described herein, the strain transfer layer is disposed on the top surface of the sensor die, and the sensor die is supported by mechanical anchors at the bottom surface of the sensor die. The sensing element can be either piezoresistive or piezoelectric and can be electrically coupled to the mechanical anchors.

According to another implementation, the strain transfer layer is disposed on the bottom surface of the sensor die, and a protective layer is disposed on the top surface of the sensor die. In this solution, the strain transfer layer also serves as a mechanical support for the MEMS force sensor while the MEMS force sensor is mounted to a force sensitive surface. Additionally, the sensing element can be either piezoresistive or piezoelectric.

Another example MEMS force sensor is described herein. The MEMS force sensor can include a sensor die configured to receive an applied force, where the sensor die defines a top side and a bottom side opposite thereto. The MEMS force sensor can also include at least one strain sensing element arranged on the sensor die, a strain transfer layer arranged on the top side of the sensor die, and at least one mechanical anchor arranged on the bottom side of the sensor die. The at least one strain sensing element can be configured to convert a strain to an analog electrical signal that is proportional to the strain. The strain transfer layer can be configured to transfer the strain to the sensor die.

Alternatively or additionally, the at least one mechanical anchor can be configured to directly attach to an external surface. This allows strain to be transferred properly to the sensor die.

Alternatively or additionally, the at least one strain sensing element can at least partially overlap with the at least one mechanical anchor.

Alternatively or additionally, the at least one mechanical anchor and the at least one strain sensing element can be electrically coupled.

Alternatively or additionally, the strain transfer layer can extend entirely over a top surface of the sensor die and wraps around an edge of the sensor die.

Alternatively or additionally, the strain transfer layer can be coextensive with a top surface of the sensor die.

Alternatively or additionally, the strain transfer layer can extend only partially over a top surface of the sensor die.

Alternatively or additionally, the strain transfer layer can be formed of a material softer than silicon. Alternatively, the strain transfer layer can be formed of a material harder than silicon.

Alternatively or additionally, the at least one strain sensing element can be formed of a piezoresistive material or a piezoelectric material.

Another example MEMS force sensor is described herein. The MEMS force sensor can include a sensor die configured to receive an applied force, where the sensor die defines a top side and a bottom side opposite thereto. The MEMS force sensor can also include at least one strain sensing element arranged on the sensor die, a strain transfer layer arranged on the bottom side of the sensor die, and a protective layer arranged on the top side of the sensor die. The at least one strain sensing element can be configured to convert a strain to an analog electrical signal that is proportional to the strain. The strain transfer layer can be configured to transfer the strain to the sensor die.

Alternatively or additionally, the MEMS force sensor can include an electrical connector arranged on the strain transfer layer. The at least one strain sensing element and the electrical connector can be electrically coupled.

Alternatively or additionally, the MEMS force sensor can include a bonding wire. The protective layer can cover and protect the bonding wire.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features will become more apparent in the detailed description in which reference is made to the appended drawings wherein.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a sensing element" can include two or more such sensing elements unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Figure 1:
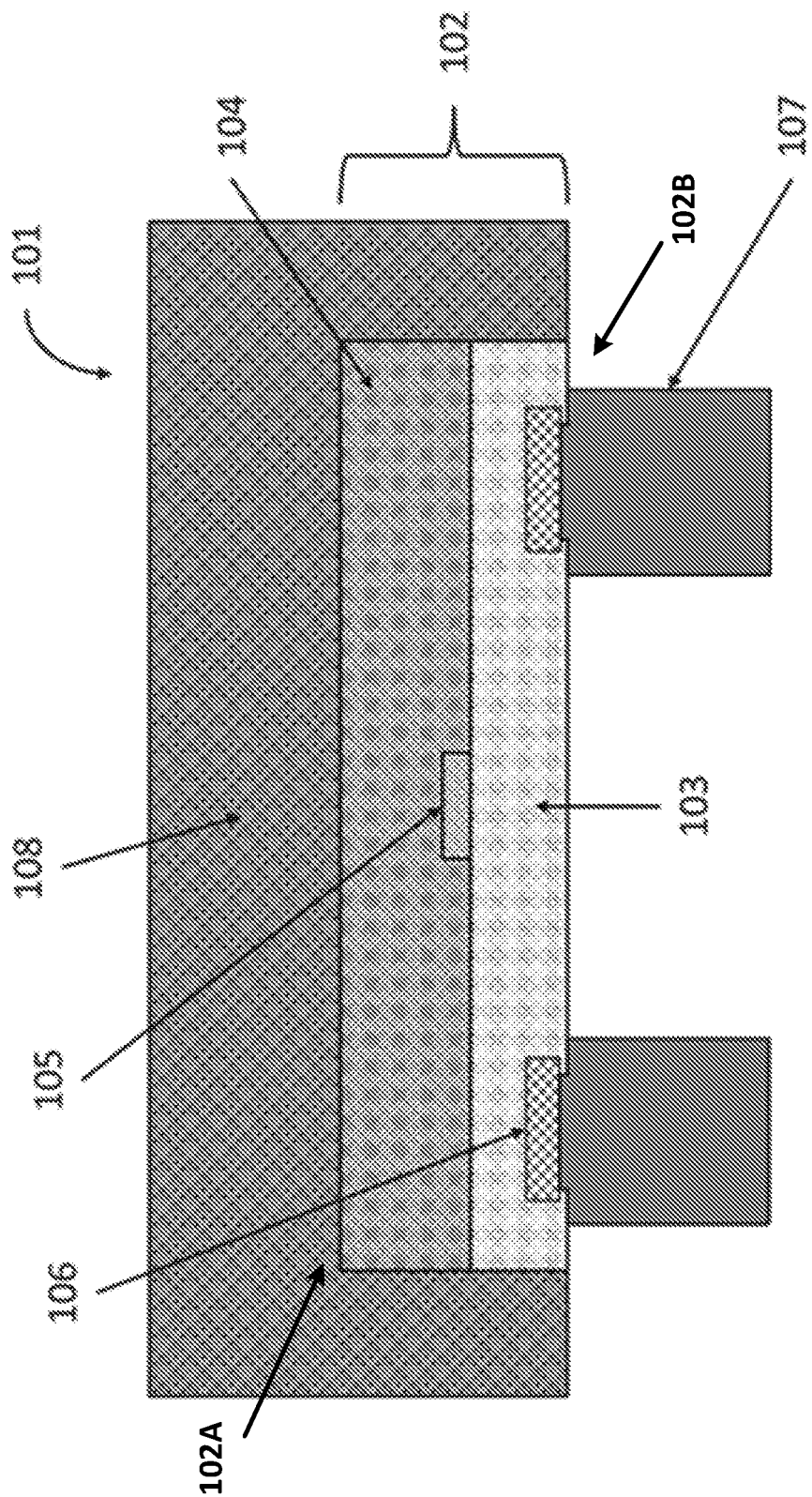
FIG. 1 is a cross-sectional view of a MEMS force sensor according to an implementation described herein. The MEMS force sensor includes a piezoresistive sensing element with a mechanical anchor disposed on the bottom side of the sensor die and a strain transfer layer disposed on the top side of the sensor die. The strain transfer layer is larger than the sensor die.

Referring now to FIG. 1, a microelectromechanical system ("MEMS") force sensor 101 for measuring a force applied to at least a portion thereof is described. The MEMS force sensor 101 can include a sensor die 102, which defines opposing sides 102A and 102B. For example, the top side and the bottom side are labeled 102A and 102B, respectively. As described below, a strain transfer layer 108 can be disposed on the top side 102A of the sensor die 102. As shown in FIG. 1, the strain transfer layer 108 is arranged on (e.g., layered on top of, deposited on, formed on, in contact with, etc.) a top surface of the sensor die 102. Additionally, a mechanical anchor 107 can be disposed on the bottom side 102B of the sensor die 102. In other words, the mechanical anchor 107 can be arranged on an opposite side of the sensor die 102 in relation to the strain transfer layer 108. The mechanical anchors 108 can be used to mount the MEMS force sensor 101 to an external surface such as a portion of a force-sensitive device and/or another circuit substrate. The external surface can be part of a multi-layer stacking structure and can optionally provide electrical coupling of the MEMS force sensor 101 to other electronics components. It should be understood that the number of mechanical anchors 107 (i.e., two) shown in FIG. 1 is only provided as an example. This disclosure contemplates that the MEMS force sensor 101 can include more or less mechanical anchors than as shown in FIG. 1.

The sensor die 102 can further include a dielectric layer 103, a semiconductor layer 104, a piezoresistive sensing element 105, and a metal layer 106. The metal layer 106 can be electrically conductive material (e.g., aluminum, gold, silver, etc.), the semiconductor layer 104 can be silicon or other semiconductor material (e.g., gallium arsenide (GaAs) or silicon carbide (SiC)), and the dielectric layer 103 can be a dielectric material. As shown in FIG. 1, the piezoresistive sensing element 105 is arranged on the semiconductor material 104, and the dielectric layer 103 is provided over the surface of the semiconductor material 104 on which the piezoresistive sensing element 105 is arranged. For example, the piezoresistive sensing element 105 can be disposed on the bottom side 102B of the sensor die 102, i.e., the piezoresistive sensing element 105 can be arranged on an opposite side of the sensor die 102 in relation to the strain transfer layer 108. Additionally, the piezoresistive sensing element 105 can be diffused, deposited, or implanted on a surface of the semiconductor layer 104. It should be understood that a single piezoresistive sensing element is shown in FIG. 1 only as an example. This disclosure contemplates that the MEMS force sensor 101 can include a plurality of piezoresistive sensing elements.

The piezoresistive sensing element 105 can change an electrical characteristic (i.e., resistance) in response to deflection of a portion of the sensor die 102. The change in electrical characteristic can be detected as an analog electrical signal (e.g., change in voltage). For example, as strain is induced in the sensor die 102 proportional to the force "F" applied to the MEMS force sensor 101, a localized strain is produced on the piezoresistive sensing element 105 such that the piezoresistive sensing element 105 experiences compression or tension, depending on its specific orientation. As the piezoresistive sensing element 105 compresses and tenses, its resistivity changes in opposite fashion. Accordingly, a Wheatstone bridge circuit including a plurality (e.g., four) piezoresistive sensing elements (e.g., two of each orientation relative to strain) becomes unbalanced and produces a differential voltage across the positive signal terminal and the negative signal terminal. This differential voltage is directly proportional to the applied force "F" on the MEMS force sensor 101. Example MEMS force sensors using piezoresistive sensing elements are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

As described above, the mechanical anchor 107 can be used to attach the MEMS force sensor 101 to an external surface such as another circuit substrate. For example, the mechanical anchor 107 can be configured to directly attach to an external surface. This disclosure contemplates that the external surface is a solid surface that serves as an adequate mechanical ground that does not deform. Attaching the MEMS force sensor 101 to such a solid surface using the mechanical anchor 107 allows the strain to be transferred properly to the sensor die 102. In some implementations, the piezoresistive sensing element 105 can be electrically coupled to the mechanical anchor 107. Optionally, the piezoresistive sensing element 105 and the mechanical anchor 107 can overlap with one another such that they can be electrically coupled using a conductive through-hole. In this implementation, the mechanical anchor 107 can be a conductive material such as metal. For example, the piezoresistive sensing element 105 can be electrically coupled to the metal layer 106, which can be electrically coupled to the mechanical anchor 107. In this way, the differential voltage signal described above can be transferred from the sensor die 102 to a circuit for further processing.

As depicted in FIG. 1, the strain transfer layer 108 can be larger than the sensor die 102. For example, in FIG. 1, the strain transfer layer 108 extends entirely over the top surface of the sensor die 102 and also wraps around the edges of the sensor die 102. In this configuration, the strain transfer layer 108 can protect the sensor die 102 (e.g., made of brittle semiconductor material such as Si) from breakage caused by impact. The strain transfer layer 108 can also improve the sensitivity of the MEMS force sensor 101. In some implementations, the strain transfer layer 108 is comprised of a material softer than the semiconductor layer 104 material (e.g., silicon), such as molding compound, plastic, or tape, for example. For example, a material hardness (e.g., ability to resist plastic deformation) of the strain transfer layer 108 can be less than a material hardness of the semiconductor layer 104. In other implementations, the strain transfer layer 108 is comprised of a material harder than the semiconductor layer 104 material (e.g., silicon), such as nickel, titanium, or steel, for example. For example, a material hardness (e.g., ability to resist plastic deformation) of the strain transfer layer 108 can be greater than a material hardness of the semiconductor layer 104. Alternatively or additionally, in some implementations, the strain sensing element (e.g., piezoresistive sensing element 105 in FIGS. 1-3 and 7) is comprised of a piezoresistive material, such as single crystal silicon, poly-silicon, or gallium arsenide, for example. In other implementations, the strain sensing element (e.g., piezoelectric sensing element 405 in FIGS. 4-6 and 8) is comprised of piezoelectric material, such as aluminum nitride, zinc oxide, or lead zirconate titanate (PZT), for example. It should be understood that the above materials for the strain transfer layer 108 and/or strain sensing element are provided only as examples. This disclosure contemplates that the strain transfer layer and/or strain sensing element can be made of other materials. By including the strain transfer layer as part of the MEMS force sensor 101, the strain is transferred through the strain transfer layer 108 to the MEMS force sensor 101, which can be mounted to a solid surface.

Figure 2:
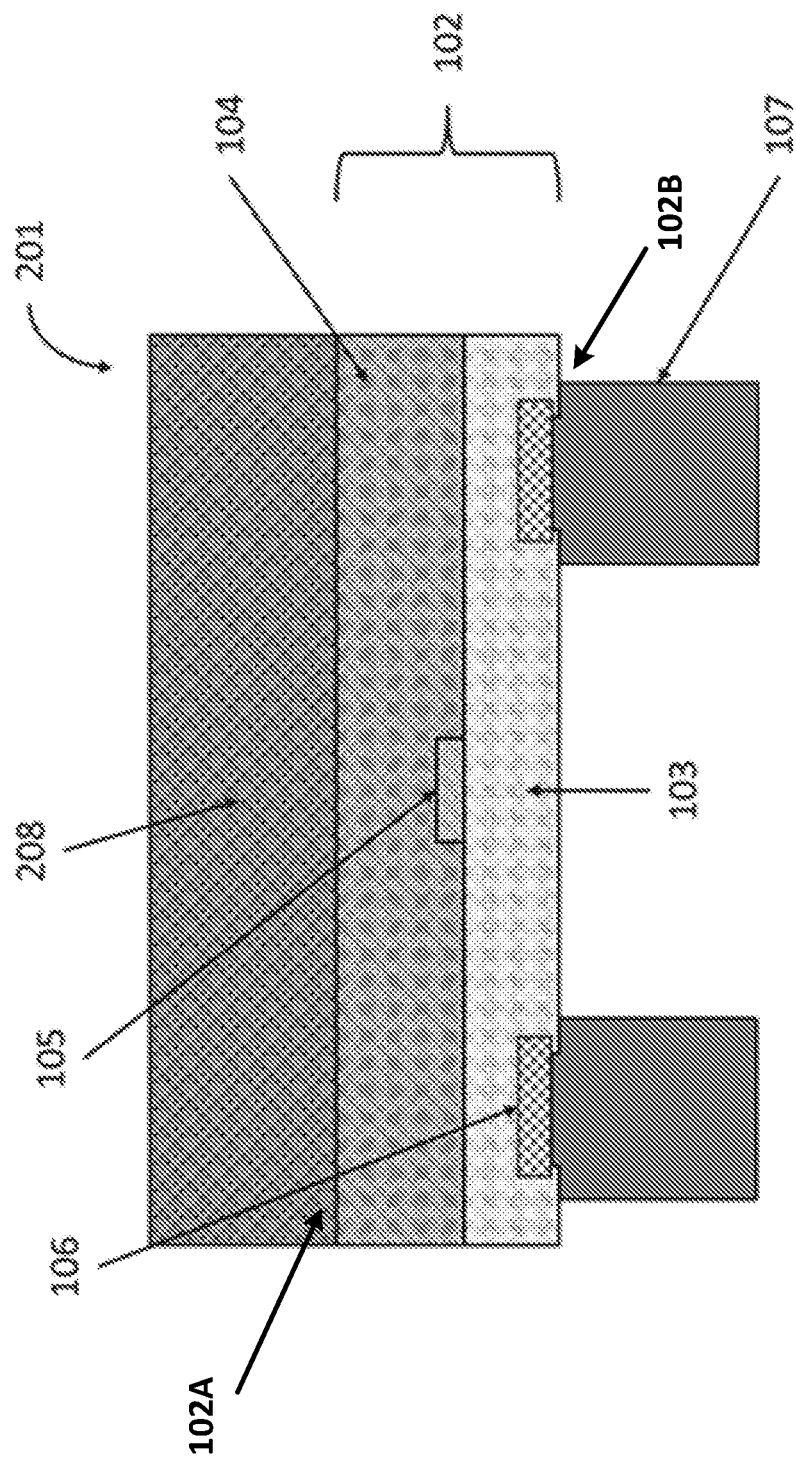
FIG. 2 is a cross-sectional view of another MEMS force sensor according to an implementation described herein. The MEMS force sensor includes a piezoresistive sensing element with a mechanical anchor disposed on the bottom side of the sensor die and a strain transfer layer disposed on the top side of the sensor die. The strain transfer layer is the same size as the sensor die.

Referring now to FIG. 2, a microelectromechanical system ("MEMS") force sensor 201 for measuring a force applied to at least a portion thereof is described. The MEMS force sensor 201 can include a sensor die 102 and a strain transfer layer 208. The sensor die 102 can define opposing sides 102A and 102B. The sensor die 102 can further include a dielectric layer 103, a semiconductor layer 104, a piezoresistive sensing element 105, and a metal layer 106. Additionally, the MEMS force sensor 201 can include a mechanical anchor 107. These features of the MEMS force sensor 201 are similar to those described above with regard to FIG. 1 and are therefore not described in further detail below. As depicted in FIG. 2, the strain transfer layer 208 can be equal in size to the sensor die 102. For example, the strain transfer layer 208 is coextensive with the top surface of the sensor die 102. In other words, the strain transfer layer 208 completely covers the top surface of the sensor die 102. Unlike the strain transfer layer shown in FIG. 1, however, the strain transfer layer 208 does not wrap around the edges of the sensor die 102. In this configuration, the strain transfer layer 208 can protect the top side 102A of the sensor die 102 from breakage caused by impact. The strain transfer layer 108 can also improve the sensitivity of the MEMS force sensor 201. By including the strain transfer layer as part of the MEMS force sensor 201, the strain is transferred through the strain transfer layer 208 to the MEMS force sensor 201, which can be mounted to a solid surface.

Figure 3:
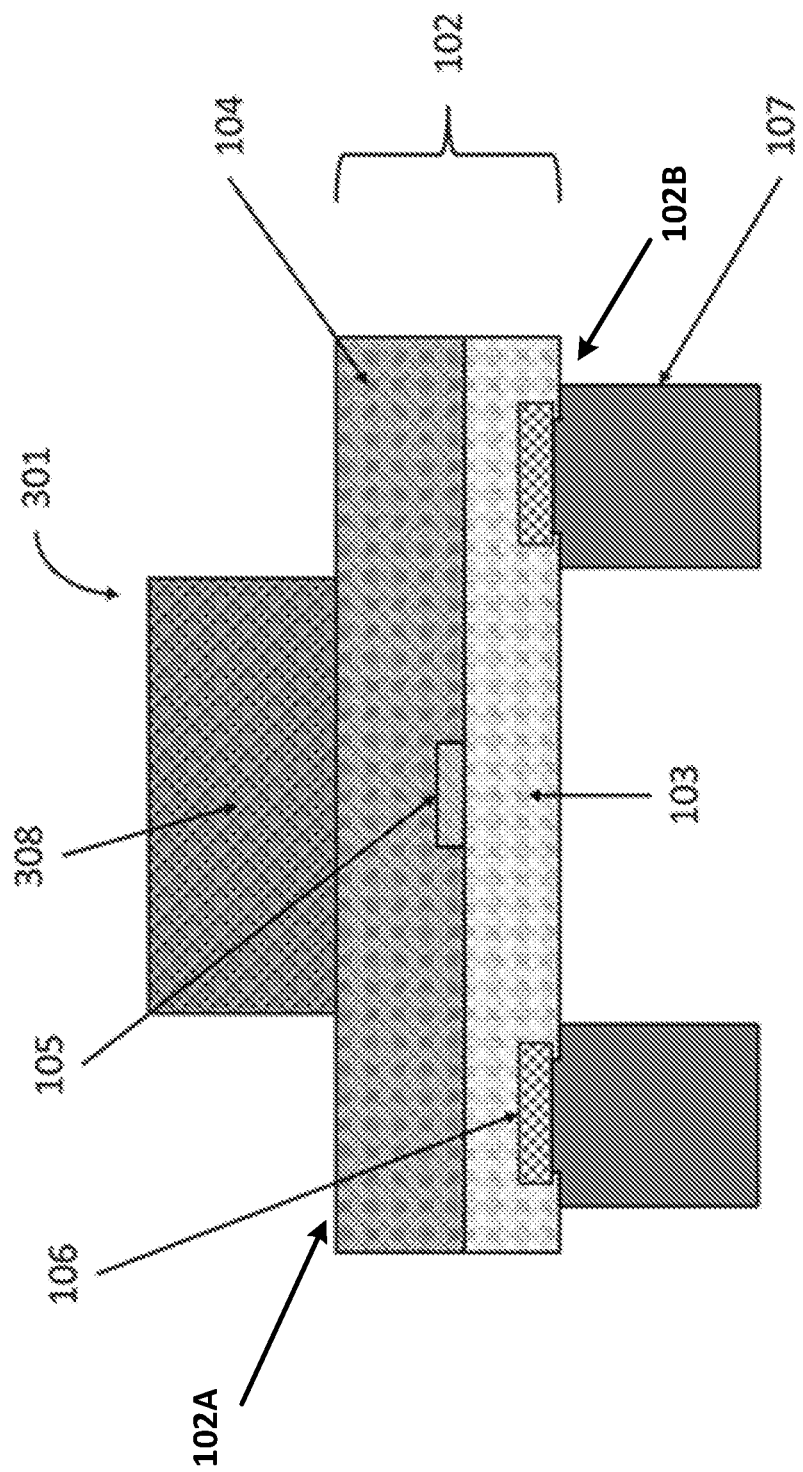
FIG. 3 is a cross-sectional view of another MEMS force sensor according to an implementation described herein. The MEMS force sensor includes a piezoresistive sensing element with a mechanical anchor disposed on the bottom side of the sensor die and a strain transfer layer disposed on the top side of the sensor die. The strain transfer layer is smaller than the sensor die.

Referring now to FIG. 3, a microelectromechanical system ("MEMS") force sensor 301 for measuring a force applied to at least a portion thereof is described. The MEMS force sensor 301 can include a sensor die 102 and a strain transfer layer 308. The sensor die 102 can define opposing sides 102A and 102B. The sensor die 102 can further include a dielectric layer 103, a semiconductor layer 104, a piezoresistive sensing element 105, and a metal layer 106. Additionally, the MEMS force sensor 301 can include a mechanical anchor 107. These features of the MEMS force sensor 301 are similar to those described above with regard to FIG. 1 and are therefore not described in further detail below. As depicted in FIG. 3, the strain transfer layer 308 can be smaller than the sensor die 102. For example, the strain transfer layer 308 extends only partially over the top surface of the sensor die 102. Unlike the strain transfer layer shown in FIG. 2, the strain transfer layer 308 does not completely cover the top surface of the sensor die 102. In this configuration, the strain transfer layer 308 can provide a concentric load to the sensor die 102. The strain transfer layer 308 can also improve the sensitivity of the MEMS force sensor 301. By including the strain transfer layer as part of the MEMS force sensor 301, the strain is transferred through the strain transfer layer 308 to the MEMS force sensor 301, which can be mounted to a solid surface.

Figure 4:
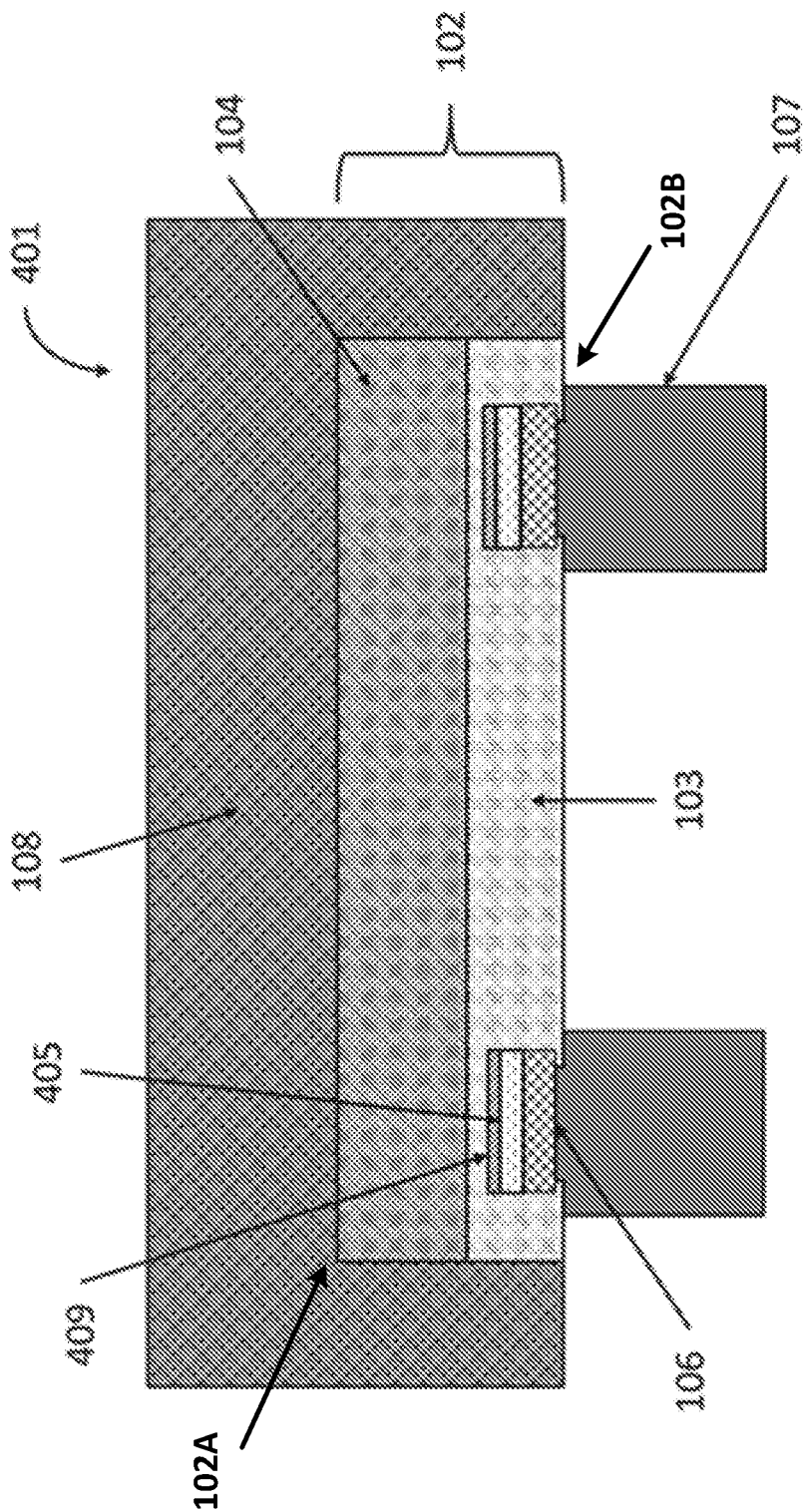
FIG. 4 is a cross-sectional view of another MEMS force sensor according to an implementation described herein. The MEMS force sensor includes a piezoelectric sensing element with a mechanical anchor disposed on the bottom side of the sensor die and a strain transfer layer disposed on the top side of the sensor die. The strain transfer layer is larger than the sensor die.

Referring now to FIG. 4, a microelectromechanical system ("MEMS") force sensor 401 for measuring a force applied to at least a portion thereof is described. Except for the sensing element, the MEMS force sensor 401 has the same features as the MEMS force sensor described with regard to FIG. 1. In particular, the MEMS force sensor 401 can include a sensor die 102 and a strain transfer layer 108. The sensor die 102 can define opposing sides 102A and 102B. The sensor die 102 can further include a dielectric layer 103, a semiconductor layer 104, a top electrode 409, a piezoelectric sensing element 405, and a metal layer 106. The metal layer 106 serves as the bottom electrode. Additionally, the MEMS force sensor 401 can include a mechanical anchor 107. As depicted in FIG. 4, the strain transfer layer 108 can be larger than the sensor die 102. For example, in FIG. 4, the strain transfer layer 108 extends entirely over the top surface of the sensor die 102 and also wraps around the edges of the sensor die 102. By including the strain transfer layer as part of the MEMS force sensor 401, the strain is transferred through the strain transfer layer 108 to the MEMS force sensor 401, which can be mounted to a solid surface.

As shown in FIG. 4, the dielectric layer 103 is provided over the surface of the semiconductor material 104, and the piezoelectric sensing element 405 is arranged on the dielectric layer 103. For example, the piezoelectric sensing element 405 can be disposed on the bottom side 102B of the sensor die 102, i.e., the piezoelectric sensing element 405 can be arranged on an opposite side of the sensor die 102 in relation to the strain transfer layer 108. It should be understood that a single piezoelectric sensing element is shown in FIG. 4 only as an example. This disclosure contemplates that the MEMS force sensor 401 can include a plurality of piezoelectric sensing elements. Additionally, this disclosure contemplates that the piezoelectric sensing element 405 can be deposited on a surface of the dielectric layer 103. The piezoelectric sensing element 405, which is arranged between opposing electrodes as described above, can change an electrical characteristic (i.e., charge) in response to deflection of a portion of the sensor die 102. For example, as strain is induced in the sensor die 102 proportional to the force "F" applied to the MEMS force sensor 401, the piezoelectric sensing element 405 changes charge. Thus, the change in electrical characteristic can be detected as an analog electrical signal (e.g., change in voltage) at the top and bottom electrodes 409 and 106. This disclosure contemplates that the change in voltage can be correlated with the amount of "F" applied to the MEMS force sensor 401.

Figure 5:
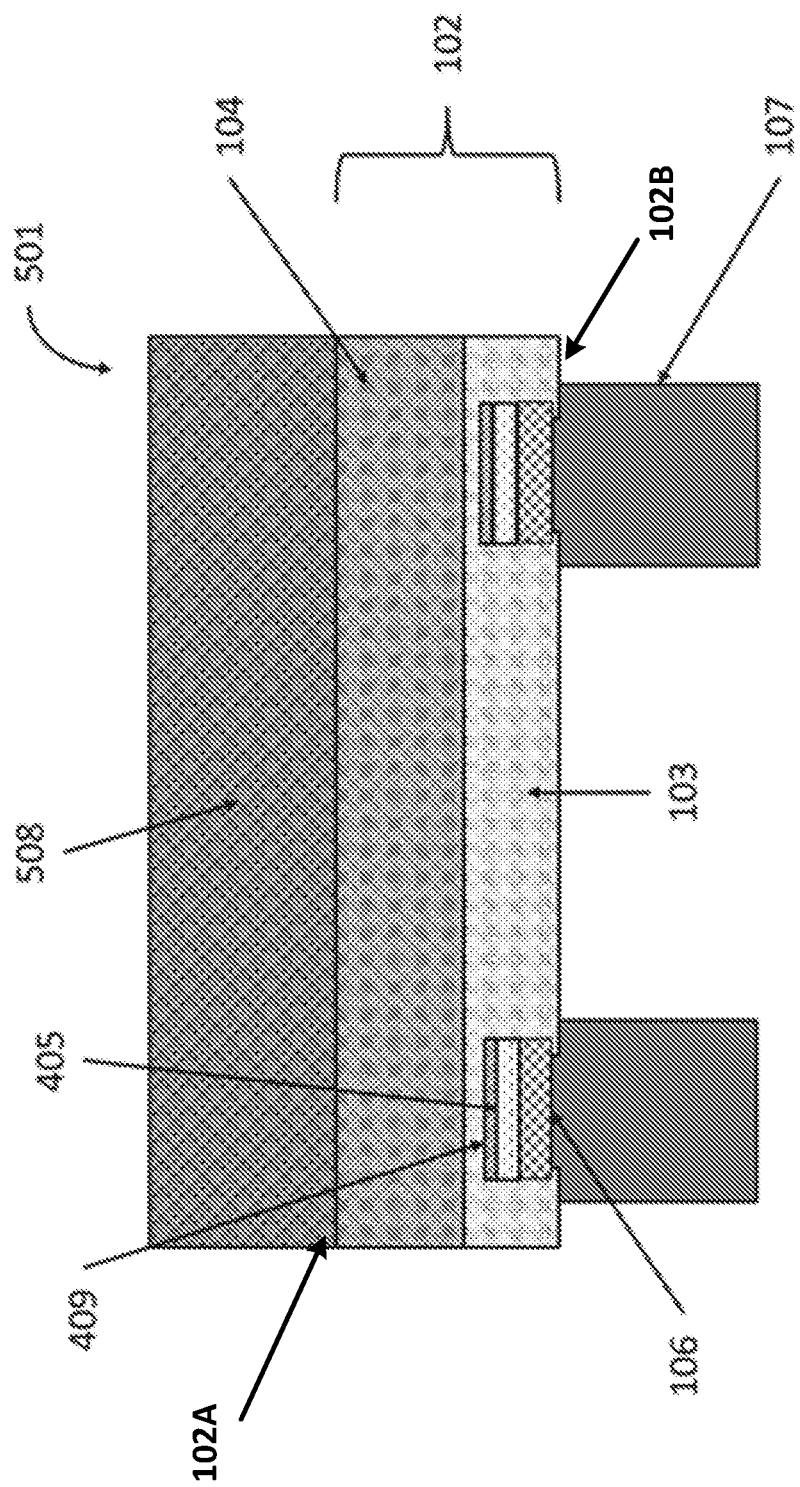
FIG. 5 is a cross-sectional view of another MEMS force sensor according to an implementation described herein. The MEMS force sensor includes a piezoelectric sensing element with a mechanical anchor disposed on the bottom side of the sensor die and a strain transfer layer disposed on the top side of the sensor die. The strain transfer layer is the same size as the sensor die.

Referring now to FIG. 5, a microelectromechanical system ("MEMS") force sensor 501 for measuring a force applied to at least a portion thereof is described. The MEMS force sensor 501 can include a sensor die 102 and a strain transfer layer 508. The sensor die 102 can define opposing sides 102A and 102B. The sensor die 102 can further include a dielectric layer 103, a semiconductor layer 104, a top electrode 409, a piezoelectric sensing element 405, and a metal layer 106. The metal layer 106 serves as the bottom electrode for the piezoelectric sensing element 405. Additionally, the MEMS force sensor 501 can include a mechanical anchor 107. These features of the MEMS force sensor 501 are similar to those described above with regard to FIG. 4 and are therefore not described in further detail below. As depicted in FIG. 5, the strain transfer layer 508 can be equal in size to the sensor die 102. For example, the strain transfer layer 508 is coextensive with the top surface of the sensor die 102. In other words, the strain transfer layer 508 completely covers the top surface of the sensor die 102. Unlike the strain transfer layer shown in FIG. 4, however, the strain transfer layer 508 does not wrap around the edges of the sensor die 102. By including the strain transfer layer as part of the MEMS force sensor 501, the strain is transferred through the strain transfer layer 508 to the MEMS force sensor 501, which can be mounted to a solid surface.

Figure 6:
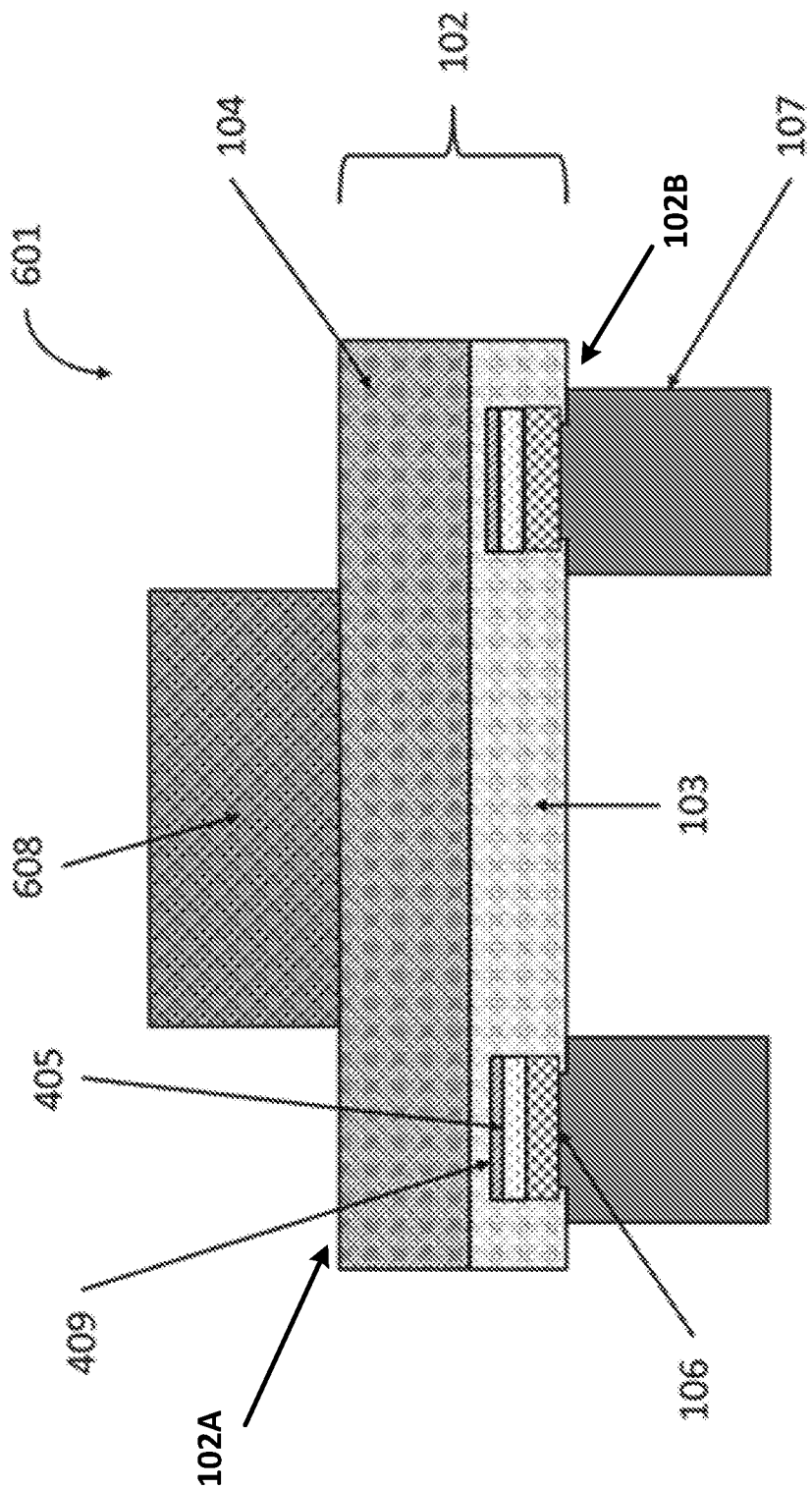
FIG. 6 is a cross-sectional view of another MEMS force sensor according to an implementation described herein. The MEMS force sensor includes a piezoelectric sensing element with a mechanical anchor disposed on the bottom side of the sensor die and a strain transfer layer disposed on the top side of the sensor die. The strain transfer layer is smaller than the sensor die.

Referring now to FIG. 6, a microelectromechanical system ("MEMS") force sensor 601 for measuring a force applied to at least a portion thereof is described. The MEMS force sensor 601 can include a sensor die 102 and a strain transfer layer 608. The sensor die 102 can define opposing sides 102A and 102B. The sensor die 102 can further include a dielectric layer 103, a semiconductor layer 104, a top electrode 409, a piezoelectric sensing element 405, and a metal layer 106. The metal layer 106 serves as the bottom electrode for the piezoelectric sensing element 405. Additionally, the MEMS force sensor 601 can include a mechanical anchor 107. These features of the MEMS force sensor 601 are similar to those described above with regard to FIG. 4 and are therefore not described in further detail below. As depicted in FIG. 6, the strain transfer layer 608 can be smaller than the sensor die 102. For example, the strain transfer layer 608 extends only partially over the top surface of the sensor die 102. Unlike the strain transfer layer shown in FIG. 5, the strain transfer layer 608 does not completely cover the top surface of the sensor die 102. By including the strain transfer layer as part of the MEMS force sensor 601, the strain is transferred through the strain transfer layer 608 to the MEMS force sensor 601, which can be mounted to a solid surface.

Figure 7:
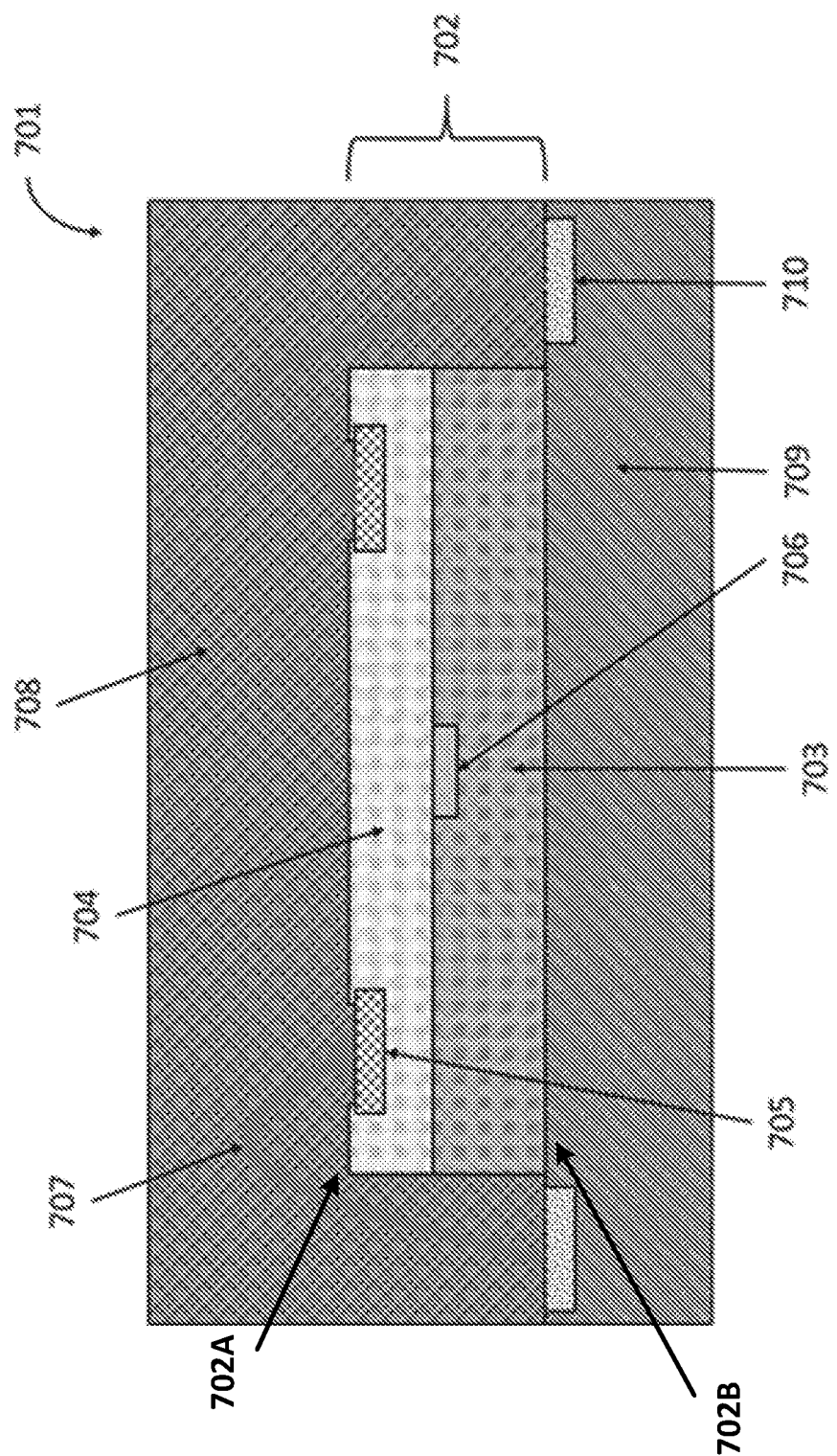
FIG. 7 is a cross-sectional view of another MEMS force sensor according to an implementation described herein. The MEMS force sensor includes a piezoresistive sensing element with a strain transfer layer disposed on the bottom side of the sensor die and a protective layer on the top side of the sensor die.

Referring now to FIG. 7, a microelectromechanical system ("MEMS") force sensor 701 for measuring a force applied to at least a portion thereof is described. The MEMS force sensor 701 can include a sensor die 702, which defines opposing sides 702A and 702B. For example, the top side and the bottom side are labeled 702A and 702B, respectively. As described below, a strain transfer layer 709 can be disposed on the bottom side 702B of the sensor die 102. As shown in FIG. 7, the strain transfer layer 709 is arranged on (e.g., layered on top of, deposited on, formed on, in contact with, etc.) a bottom surface of the sensor die 702. Additionally, a protective layer 708 can be disposed on the top side 702A of the sensor die 702. As shown in FIG. 7, the protective layer 708 is arranged on (e.g., layered on top of, deposited on, formed on, in contact with, etc.) a top surface of the sensor die 702. In other words, the protective layer 708 can be arranged on an opposite side of the sensor die 702 in relation to the strain transfer layer 709.

The sensor die 702 can further include a semiconductor layer 703, a dielectric layer 704, a metal layer 705, and a piezoresistive sensing element 706. The metal layer 705 can be electrically conductive material (e.g., aluminum, gold, silver, etc.), the semiconductor layer 703 can be silicon or other semiconductor material, and the dielectric layer 704 can be a dielectric material. As shown in FIG. 7, the piezoresistive sensing element 706 is arranged on the semiconductor material 703, and the dielectric layer 704 is provided over the surface of the semiconductor material 703 on which the piezoresistive sensing element 706 is arranged. The piezoresistive sensing element 706 can be disposed on the top side 702A of the sensor die 702, i.e., the piezoresistive sensing element 706 can be arranged on an opposite side of the sensor die 702 in relation to the strain transfer layer 709. It should be understood that a single piezoresistive sensing element is shown in FIG. 7 only as an example. This disclosure contemplates that the MEMS force sensor 701 can include a plurality of piezoresistive sensing elements. Additionally, this disclosure contemplates that the piezoresistive sensing element 706 can be diffused, deposited, or implanted on a surface of the semiconductor layer 703. The functionality of a piezoresistive sensing element is described above.

As shown in FIG. 7, the protective layer 708 covers a bonding wire 707 and protects the top surface of the sensor die 702. The protective layer 708 can be formed of a resin, epoxy, plastic, or other material that can be molded. The bonding wire 707 can be a conductive material such as metal. In some implementations, the piezoresistive sensing element 706 can be electrically coupled to the metal layer 705, which can be electrically coupled to an electrical connector 710 via the bonding wire 707. As shown in FIG. 7, the electrical connector 710 can be arranged on the strain transfer layer 709. In some implementations, the electrical connector 710 can be a metal frame provided on the strain transfer layer 709. Accordingly, the differential voltage signal described above can be transferred from the sensor die 702 to a circuit for further processing. It should be understood that the number of bonding wires 707 (i.e., two) and/or the number of electrical connectors 710 (i.e., two) shown in FIG. 7 are only provided as an example. This disclosure contemplates that the MEMS force sensor 701 can include more or less bonding wires and/or more or less electrical connectors than as shown in FIG. 7. Additionally, the MEMS force sensor 701 can be mounted to a force sensing surface (e.g., a surface external to the MEMS force sensor 701) through the strain transfer layer 709. Materials for the strain transfer layer are described above. By including the strain transfer layer as part of the MEMS force sensor 701, the strain is transferred through the strain transfer layer 709 to the MEMS force sensor 701 while the MEMS force sensor 701 is mounted to the force sensing surface.

Figure 8:
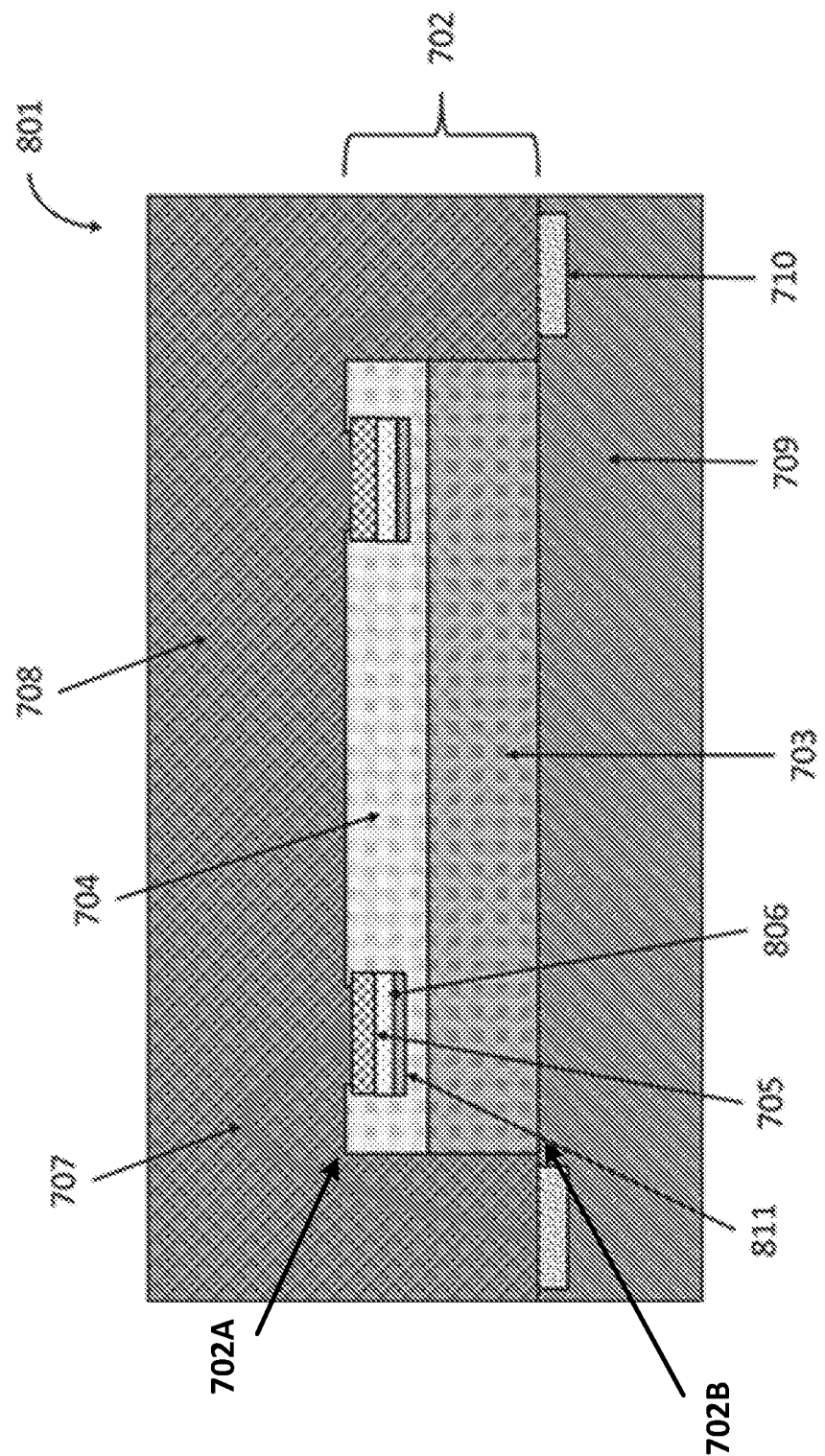
FIG. 8 is a cross-sectional view of another MEMS force sensor according to an implementation described herein. The MEMS force sensor includes a piezoelectric sensing element with a strain transfer layer disposed on the bottom side of the sensor die and a protective layer on the top side of the sensor die.

Referring now to FIG. 8, a microelectromechanical system ("MEMS") force sensor 801 for measuring a force applied to at least a portion thereof is described. Except for the sensing element, the MEMS force sensor 801 has the same features as the MEMS force sensor described with regard to FIG. 7. In particular, the MEMS force sensor 801 can include a sensor die 702 and a strain transfer layer 709. The sensor die 702 can define opposing sides 702A and 702B. The sensor die 102 can further include a semiconductor layer 703, a dielectric layer 704, a metal layer 705, a piezoelectric sensing element 806, and a bottom electrode 811. The metal layer 705 serves as the top electrode. The functionality of a piezoelectric sensing element is described above. Additionally, the MEMS force sensor 801 can include a bonding wire 707 for electrically coupling the metal layer 705 and an electrical connector 710, which allows for transfer of a differential voltage signal from the sensor die 702 to a circuit for further processing. Further, the MEMS force sensor 801 can include a protective layer 708 that covers the bonding wire 707 and protects the top surface of the sensor die 702. By including the strain transfer layer as part of the MEMS force sensor 801, the strain is transferred through the strain transfer layer 709 to the MEMS force sensor 801 while the MEMS force sensor 801 is mounted to a force sensing surface through the strain transfer layer 709.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A microelectromechanical ("MEMS") force sensor, comprising:
   a sensor die configured to receive an applied force, wherein the sensor die comprises a top side and a bottom side opposite thereto,
   at least one strain sensing element arranged on the sensor die, wherein the at least one strain sensing element is configured to convert a strain to an analog electrical signal that is proportional to the strain,
   a strain transfer layer arranged on the top side of the sensor die, wherein the strain transfer layer extends entirely over the top side of the sensor die and wraps around an edge of the sensor die, and wherein the strain transfer layer is configured to transfer the strain to the sensor die, and
   at least one mechanical anchor arranged on the bottom side of the sensor die.

2. The MEMS force sensor of claim 1, wherein the at least one mechanical anchor is configured to directly attach to an external surface of a device or substrate.

3. The MEMS force sensor of claim 1, wherein the at least one strain sensing element at least partially overlaps with the at least one mechanical anchor.

4. The MEMS force sensor of claim 1, wherein the at least one mechanical anchor and the at least one strain sensing element are electrically coupled.

5. The MEMS force sensor of claim 1, wherein the strain transfer layer is formed of a material softer than silicon.

6. The MEMS force sensor of claim 1, wherein the strain transfer layer is formed of a material harder than silicon.

7. The MEMS force sensor of claim 1, wherein the at least one strain sensing element is formed of a piezoresistive material.

8. The MEMS force sensor of claim 1, wherein the at least one strain sensing element is formed of a piezoelectric material.

9. A microelectromechanical ("MEMS") force sensor, comprising:
   a sensor die configured to receive an applied force, wherein the sensor die comprises a top side and a bottom side opposite thereto,
   at least one strain sensing element arranged on the sensor die, wherein the at least one strain sensing element is configured to convert a strain to an analog electrical signal that is proportional to the strain,
   a strain transfer layer that is disposed on the bottom side of the sensor die, wherein the strain transfer layer is configured to transfer the strain to the sensor die, and a protective layer that is disposed on the top side of the sensor die, wherein the protective layer extends entirely over the top side of the sensor die and wraps around an edge of the sensor die.

10. The MEMS force sensor of claim 9, further comprising an electrical connector arranged on the strain transfer layer, wherein the at least one strain sensing element and the electrical connector are electrically coupled.

11. The MEMS force sensor of claim 9, wherein the at least one strain sensing element is formed of piezoresistive material.

12. The MEMS force sensor of claim 9, wherein the at least one strain sensing element is formed of piezoelectric material.

13. The MEMS force sensor of claim 9, further comprising a bonding wire, wherein the protective layer covers and protects the bonding wire.

14. The MEMS force sensor of claim 9, wherein the strain transfer layer is formed of a material softer than silicon.

15. The MEMS force sensor of claim 9, wherein the strain transfer layer is formed of a material harder than silicon.

\* \* \* \* \*